(12) United States Patent
Oggioni et al.

(10) Patent No.: US 7,360,308 B2
(45) Date of Patent: Apr. 22, 2008

(54) COAXIAL VIA STRUCTURE FOR OPTIMIZING SIGNAL TRANSMISSION IN MULTIPLE LAYER ELECTRONIC DEVICE CARRIERS

(75) Inventors: Stefano S. Oggioni, Milan (IT); Gianluca Rogiani, Milan (IT); Mauro Spreafico, Sesto (IT); Giorgio Viero, Stezzano (IT)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 11/458,727

(22) Filed: Jul. 20, 2006

(65) Prior Publication Data

US 2006/0288574 A1    Dec. 28, 2006

Related U.S. Application Data

(63) Continuation of application No. 10/613,553, filed on Jul. 2, 2003, now Pat. No. 7,091,424.

(30) Foreign Application Priority Data

Oct. 10, 2002    (EP)    .................. 02368113

(51) Int. Cl.
*H01K 3/10* (2006.01)
*H05K 3/36* (2006.01)

(52) U.S. Cl. ............... 29/852; 29/825; 29/830; 174/262; 333/222

(58) Field of Classification Search ............ 29/825, 29/830, 852; 174/262; 333/222
See application file for complete search history.

(56) References Cited

U.S. PATENT DOCUMENTS

| | | | |
|---|---|---|---|
| 5,689,091 A | 11/1997 | Hamzehdoost et al. | ..... 174/255 |
| 5,949,030 A | 9/1999 | Fasano et al. | ............ 174/262 |
| 6,479,764 B1 | 11/2002 | Frana et al. | ............... 174/262 |
| 6,847,274 B2 | 1/2005 | Salmela et al. | ............. 333/222 |
| 7,081,650 B2 * | 7/2006 | Palanduz et al. | .......... 257/310 |

\* cited by examiner

*Primary Examiner*—C. J Arbes
(74) *Attorney, Agent, or Firm*—William N. Hogg; Driggs, Hogg, Daugherty & Del Zoppo Co. L.P.A.

(57) ABSTRACT

A coaxial via structure is adapted to transmit high speed signals or high intensity current through conductive layers of an electronic device carrier. The coaxial via structure comprises a central conductive track and an external conductive track separated by a dielectric material and is positioned in a core of the electronic device carrier or in the full thickness of the electronic device. The coaxial via structure can be combined with a stacked via structure so as allow efficient transmission of high speed signals across the electronic device carrier when a manufacturing process limits the creation of a full coaxial via structure across the entire electronic device carrier.

4 Claims, 7 Drawing Sheets

COAXIAL VIA STRUCTURE FOR OPTIMIZING SIGNAL TRANSMISSION IN MULTIPLE LAYER ELECTRONIC DEVICE CARRIERS

CROSS REFERENCE TO RELATED APPLICATIONS

This application is a continuation of application Ser. No. 10/613,553, filed Jul. 2, 2003, now U.S. Pat. No. 7,091,424 which claims priority of French application Serial No. 02368113.3, filed Oct. 10, 2002.

FIELD OF THE INVENTION

The present invention relates generally to the structure and manufacture of electronic printed circuit boards and chip carriers, and more specifically to a particular structure of conductive tracks in multiple layer high density electronic device carriers.

BACKGROUND OF THE INVENTION

Electronic packages used in high speed applications have an important function beyond the classical mechanical protection for the semiconductor devices that are packaged thereon. These types of packages should maintain semiconductor device performance during operation. When the switching speed of the devices goes above the 1 Gigahertz (GHz) clock rate, there is the need to consider the transmission of an electrical signal as the propagation of an electromagnetic wave, supported by current in a circuit trace, as a performance factor. This electromagnetic wave propagation is affected by the electronic packaging material properties such as dielectric constant as well as dielectric loss. There are other performance factors related to the electronic packaging structure (construction). One such performance factor has to do with the way electrical circuits are positioned in proximity to one another (tightly or widely spaced conductors). The sum of all these different factors affects the propagation of the electromagnetic waves in the electronic package. It is known that even if a material and a module structural configuration are defined, there still may be unexpected low performance. It has been proven by simulation and measurements that propagation of an electromagnetic wave can also be severely affected by many kinds of discontinuities along its propagation path. These discontinuities can comprise changes in structure, material properties, and/or design features that the electrical signal encounters as it travels through the structure. These discontinuities can translate into electrical impedance ($Z_0$) mismatches that are known to cause reflections of the signal.

All high speed electronic packages need to preserve the integrity of electromagnetic wave propagation, and this is achieved by designing and building circuit structures that have a well controlled transmission line impedance value. Controlling the impedance may not be sufficient due to the presence of other structures called parasitic elements (that may be capacitive, inductive and resistive) that become embedded within the package by the association of materials and electrical structures. These parasitic elements have very negligible effects in low speed digital applications but they can severely affect the signal propagation in high speed applications. As power levels decrease, the effects of the parasitic elements become more pronounced (from the old TTL 5 V, down to 3.3 V, 2.5 V, 1.8 V, 1.2 V), leaving a very low margin to discriminate between the "up" level from the "zero" logical status.

A good way to visualize these effects is by analyzing the eye diagram of a measurement of a transmitted train of signals. By the size of the opening in the diagram, it becomes easy to appreciate the quality of the transmitted information, as illustrated in FIGS. 1a and 1b. The more the "eye" closes, as illustrated on FIG. 1, the more difficult it is to determine whether switching transition has taken place or if the shift of the signal baseline is due to background noise.

It is possible to characterize all the "transitions", also known as discontinuities, along the signal path and to understand and rank their negative contribution (detraction) to the overall package performance. In the ranking of negative effects, the plated through hole (PTH) transition is one of the major detractors. The PTH transition effect has an inductive nature mated by a capacitive behavior when a portion of its structures is positioned close to other circuits. Such a combination acts, at high frequencies, as a low pass filter and therefore reduces the transmission line bandwidth. In high speed applications, a design is accomplished in such a way that the transmission line has a known impedance (tailored to about 50 ohms). This is done by placing a reference ground plane under the layer that carries the transmission line circuit.

Impedance value is determined as follows:

$$1 Z 0 = 60 \; r \; 1 \; ln(5.98 \; H \; 2 \; 0.8 \; W+T) \quad (1)$$

with, $$r \; 1 = r/1 - \exp(-1.55 \; H \; 1 \; H \; 2)] \quad (2)$$

wherein .epsilon..sub.r is the epoxy laminate dielectric constant, T is the copper thickness after plating, $H_1$ is the dielectric thickness plus solder mask coating thickness, $H_2$ is the dielectric thickness and W represents the line width as illustrated in FIG. 2.

These relationships of the equations above can be applied to regular lines and surface circuit features. Unfortunately, the traditional vertical transition (PTH) does not have the possibility to offer the same referenced structure with the current standard processes in place today.

To enhance the high speed performance in Surface Laminar Circuit (registered trademark of International Business Machines Corporation) products and Hyper BGA (registered trademark of International Business Machines Corporation) products, it is necessary to optimize the electric path for the electromagnetic wave. Design efforts have reduced and optimized circuit discontinuities affecting the propagating wave with low pass filtering effects reducing power and distorting shapes of the propagating waves. So far, the only exception to the optimization work has been the vertical transition, PTH, or Resin Filled Plated Through Hole, RFP, used in the Surface Laminar Circuit technology.

FIG. 3a shows a partial perspective view of an electronic device carrier illustrating a standard PTH, wherein conductive layers 300 and 305 are separated by a core 310 of a electronic device carrier that may comprise conductive layers. Core 310 is made of dielectric material such as epoxy. Conductive layer 300 comprises a track 315 for transmitting a high speed signal that is shielded by conductive track 320. Likewise, conductive layer 305 comprises track 325 that is shielded by conductive track 330. Conductive tracks 315 and 325 are electrically connected to PTH 335. PTH 335 can be formed by drilling core 310 and filling the drilled hole with conductive material or plating the drilled hole vertical wall.

FIG. 3b depicts a partial cross section view of an electronic device carrier illustrating a known PTH and RFP. For sake of illustration, a core 350 of an electronic device carrier comprises two internal conductive layers and a conductive layer on each side, i.e. core 350 has 2 signal layers and 2 power planes also known in the industry as a 2S2P core. Each side of the core is covered with a dielectric material 355, e.g. epoxy, on which external conductive tracks may be designed, e.g. conductive track 360. Electrical connections between tracks on core 350 can be accomplished by either a PTH or RFP. In this example, RFP 365 connects several conductive tracks of core 350. An RFP is formed by drilling core 350, plating the hole wall with conductive material to form a cylinder and filling the cylinder with dielectric material such as epoxy, as illustrated. Likewise, PTH 370 connects several conductive tracks of core 350.

These vertical transitions can affect 100% of high speed signals that need to go through the central core of laminate electronic device carriers. Therefore, these transitions have the highest impact on signal transmission.

Accordingly, there is a need in the art for an improved multiple layer high density electronic device carrier that overcomes the shortcomings of the prior art as described above.

SUMMARY OF THE INVENTION

An object of the invention to provide a track structure adapted for carrying high speed signals.

Another object of the invention to provide a track structure adapted for carrying high intensity currents.

According to one aspect of the invention, there is provided a coaxial via structure in an electronic device carrier adapted to connect a first conductive track of a first conductive layer on a surface of a core to another conductive track of another conductive layer on an opposite surface of the core and a third conductive track of a third conductive layer to a fourth conductive track of a fourth conductive layer, a dielectric layer being disposed between the third and fourth conductive layers, the coaxial via structure comprising a first conductive via connected to the third and fourth conductive tracks, a second via having a side wall with a conductive material thereon surrounding a substantial portion of the first conductive via, the conductive material connected to the first and the other conductive tracks, and a dielectric material disposed between the first conductive via and the conductive material on the side wall of the second via, the first and second conductive vias having a common axis, substantially perpendicular to the conductive layers.

According to another aspect of the invention, there is provided a method for building a coaxial via structure in an electronic device carrier, the method comprising the steps of forming a first hole having a side wall in a substrate of the electronic device carrier, plating a conductive material on the side wall of the first hole, filling the plated first hole with a dielectric material, forming a second hole having a side wall in the dielectric material of the filled plated first hole such that the first and second holes have substantially a common axis, a diameter of the second hole being less than a diameter of the first hole, and forming a conductive material on the side wall of the second hole.

Further advantages of the present invention will become apparent to those skilled in the art upon examination of the drawings and detailed description. It is intended that any additional advantages be incorporated herein.

BRIEF DESCRIPTION OF THE DRAWINGS

FIG. 1a represents a closed eye wherein a switching transition is not easy to distinguish from background noise and FIG. 1b represents an open eye illustrating a switching transition.

DETAILED DESCRIPTION OF THE PREFERRED EMBODIMENT

According to the invention, there is provided a coaxial via structure that may be implemented in an electronic device carrier comprising several conductive layers. Such coaxial via structure can deliver a referenced shielding element to a high speed line between conductive layers making it possible to be in compliance with geometry requirements to achieve a controlled impedance along this transition. The laminate electronic device carrier comprising the coaxial via structure according to the invention can be processed through standard manufacturing operations.

Figure 1A:
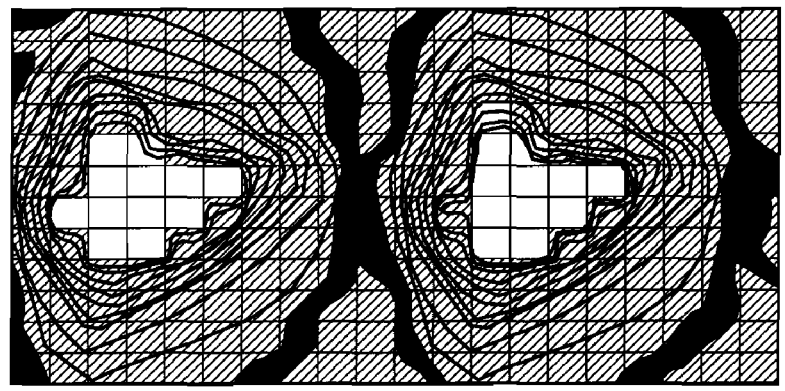
FIGS. 1a and 1b are examples of eye-diagrams illustrating the transmission of a signal.
Figure 1B:
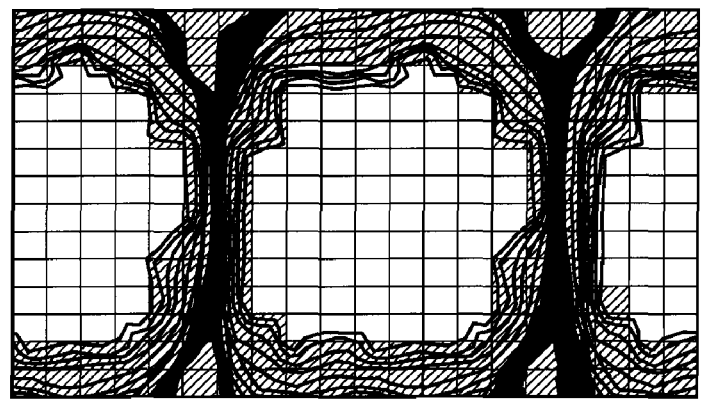
Figure 2:
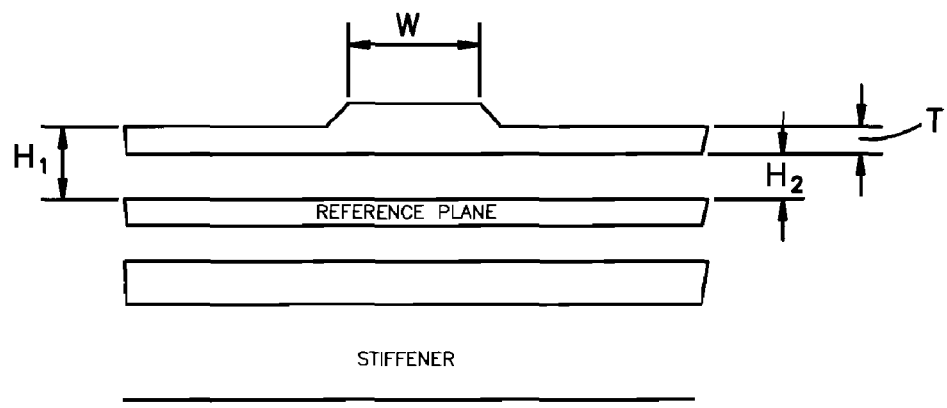
FIG. 2 is a partial cross-sectional view in elevation of an electronic device carrier illustrating a known controlled impedance signal to reference plane relationship.
Figure 3A:
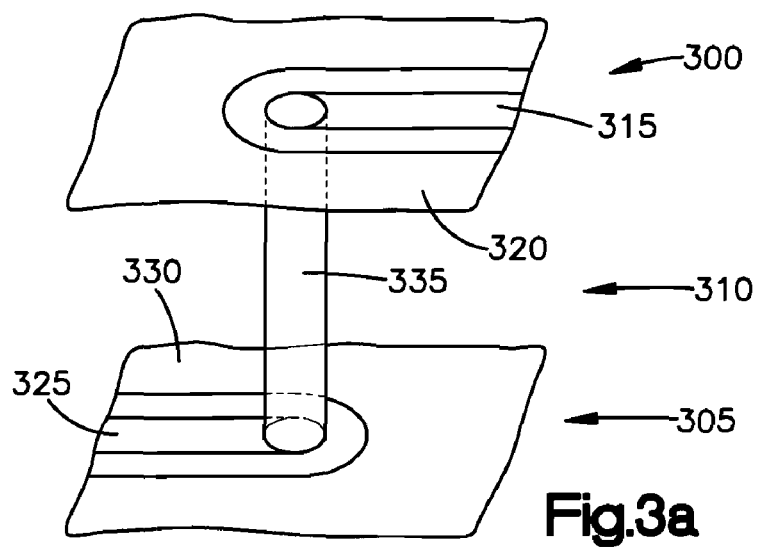
FIGS. 3a and 3b, respectively, illustrate a partial perspective and a partial cross-sectional view in elevation of an electronic device carrier illustrating a known plated through hole and resin filed plated through hole.
Figure 3B:
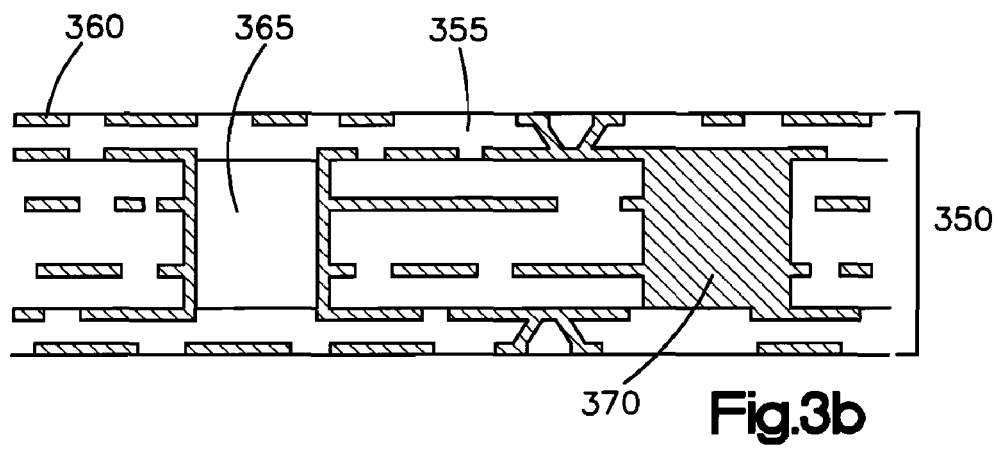
Figure 4:
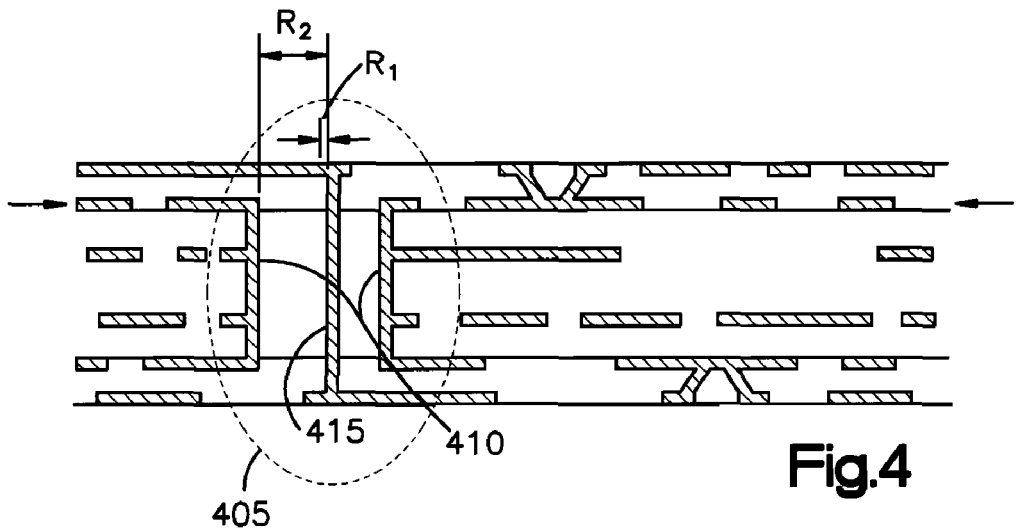
FIG. 4 illustrates a partial cross-section view in elevation of an electronic device carrier comprising the coaxial via structure of the invention.

FIG. 4 illustrates a partial cross section view of an electronic device carrier illustrating an embodiment of the coaxial via structure of the invention. In this example, the electronic device carrier is based on a 2S2P core 400 that comprises two internal conductive layers and a conductive layer on each side that are covered with a dielectric material, e.g. epoxy, on which external conductive tracks may be designed, like the external conductive trucks described in FIG. 3b. A coaxial via structure 405 comprises an RFP wherein a second hole is formed within the RFP and filled with conductive material so as to create two coaxial conductive tracks 410 and 415. Conductive track 415 is used to carry a high speed signal while conductive track 410 is used to shield this high speed signal and is preferably connected to ground.

Figure 5:
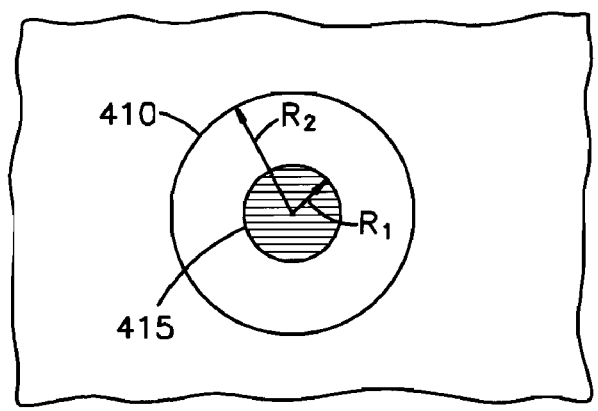
FIG. 5 illustrates a plan view of a portion of a conductive layer of the electronic device carrier of FIG. 4, taken along line A-A.

The coaxial via structure 405 provides a referenced shielding element to the high speed line such that it is possible to be in compliance with geometry requirements to achieve a controlled impedance value. For example, the impedance is computed according to the following equation for copper conductive tracks:

$$2Zc = 60\sqrt{r} \ln(R2R1) \tag{3}$$

wherein $R_1$ is the radius of the central coaxial track 415, $R_2$ is the radius of the RFP external coaxial track 410 (see FIG. 5) and $e_r$ is the dielectric constant of the dielectric material that separates both tracks. FIG. 5 represents a partial plan view of the electronic device carrier along plane A-A of FIG. 4.

The coaxial via structure is accomplished through a sequence of operations already used in the standard manufacturing processes. For example, the coaxial via structure may be formed by first drilling with a mechanical drill bit the larger diameter hole with radius $R_2$, plating the drilled hole wall, filling the plated hole with a dielectric material, e.g. epoxy resins, polyphenylene (PPE), annylated polyphenylene ether (APPE), benzocyclobutene (BCB), cyanate (triazine) resins, polytetrafluorethylene (PTFE), bismaleimide triazine (BT) resins, polyimide, polyester, phenolic or poly(phenyleneetherketone) (PEEK), drilling by the same or another method such as laser using excimer laser, CO2 laser or Nd—YAG (neodimium—yttrium aluminum garnet) infrared laser, a new pass through second hole with radius $R_1$ in the substantial center of the larger plated hole filled with dielectric material, and finally filling the second hole, for example by plating with an electroless copper process or with a conductive material.

Figure 6A:
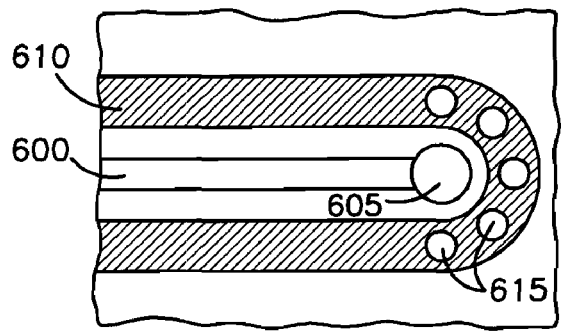
FIGS. 6a and 6b illustrate the use of shielding vias in conjunction with the coaxial via structure of the invention.

In a preferred embodiment, the electronic device carrier comprises coplanar wave-guide micro-strip structures for the top and bottom layers. FIG. 6a illustrates a partial top plan view of an electronic device carrier. There is shown a track, referred to as 600, ending with pad 605, which may be connected to the conductive material in the second hole and/or to the central track of the coaxial via structure of the invention, which can be used for transmitting a high speed signal. A coplanar track, referred to as 610, can be arranged around signal track 600 and may be formed in the same conductive layer as illustrated and connected to ground. Furthermore, several shielding vias, generically referred to as 615, are arranged in the coplanar wave-guide shielding track to be connected to a coplanar wave-guide shielding track of an adjacent layer, shown in FIG. 6b.

Figure 6B:
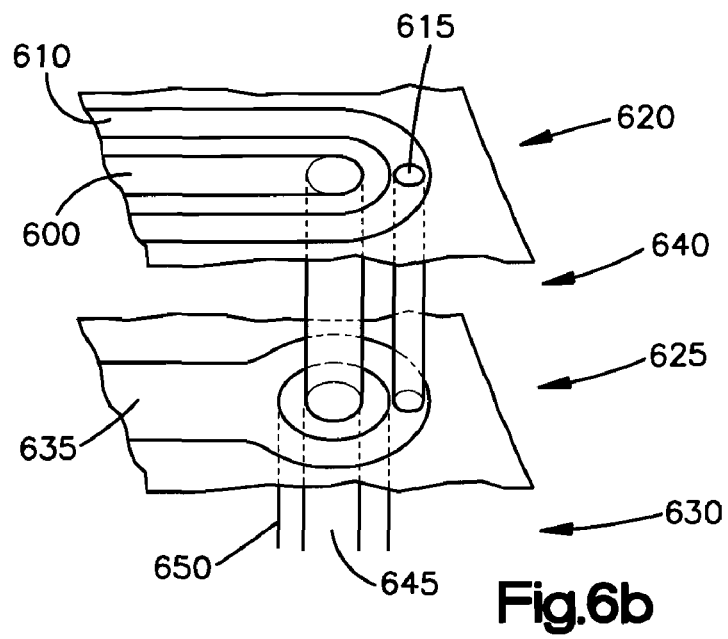

FIG. 6b shows a perspective view of the particular configuration illustrated in FIG. 6a that comprises only one shielding via 615 for sake of clarity. Conductive layer 620 comprises tracks 600 and 610. Conductive layer 625, an external surface layer of core 630, comprises track 635 that is partially superimposed to track 610. Conductive layers 620 and 625 are separated by dielectric layer 640. Electrical connection between tracks 610 and 635 is accomplished through several vias 615 (only one being represented for sake of clarity). Thus, vias 615 shield the central coaxial track 645, electrically connected to track 600 and adapted for carrying high speed signals between conductive layers 620 and 625. Track 635 is connected to the external coaxial track 650 that shields the central coaxial track 645 (second plated through hole wall) inside the core 630. As mentioned above, tracks 610, 635, and 650 and vias 615 are preferably connected to ground.

Depending upon the process used to create the coaxial via structure in the electronic device carrier, it could be possible to make the central and/or external track of the coaxial via structure in the layers that are located above and under the core. It is possible to create a central and external track of the coaxial via structure, resulting in a combination similar to that shown in FIG. 4 wherein additional conductive layers may be used. In such case, the structure preferably comprises the shielding vias presented in FIG. 6.

Figure 7:
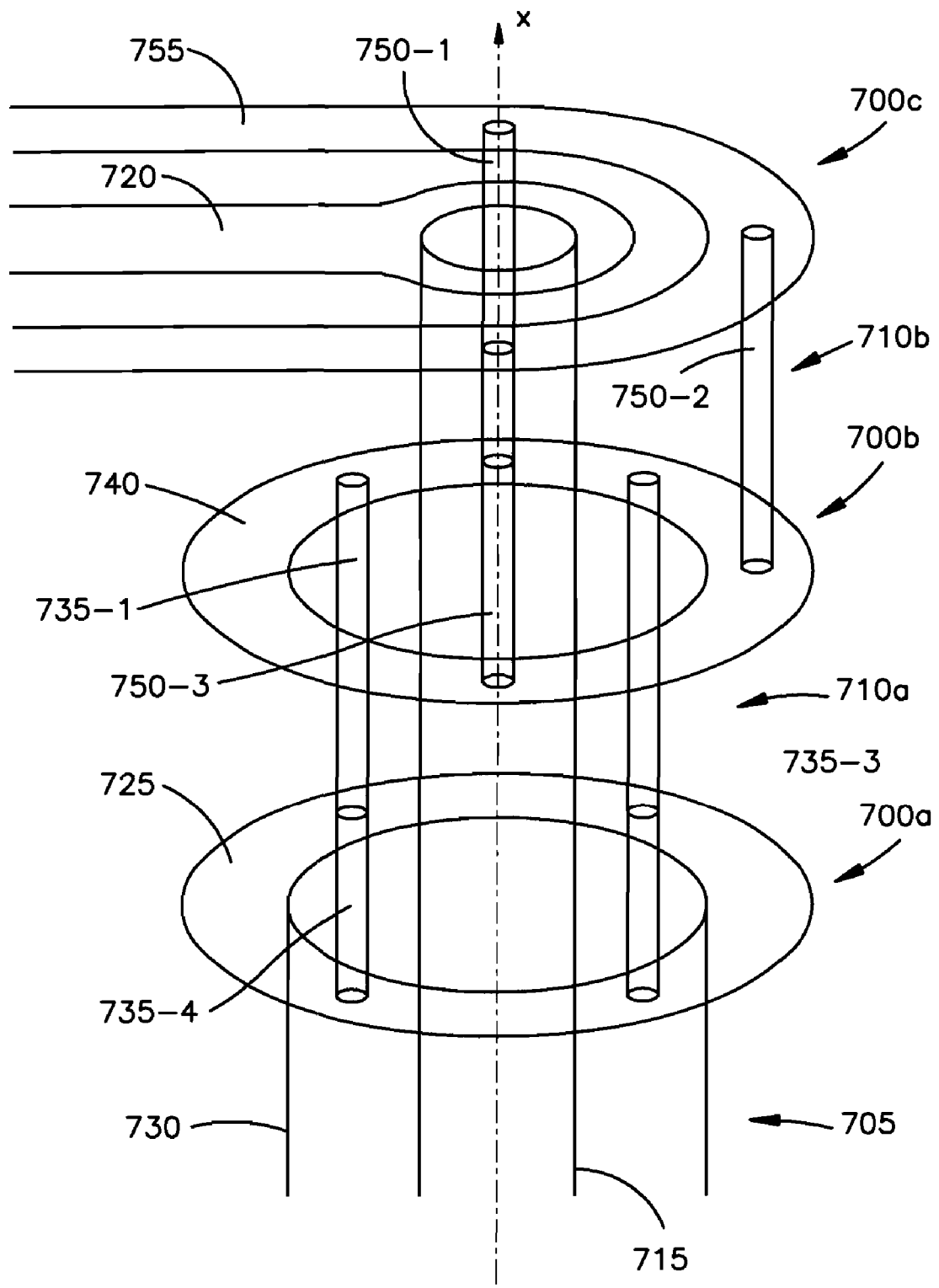
FIGS. 7 and 8 illustrate examples of the coaxial via structure of the present invention for an electronic device carrier comprising several conductive layers above and under the core utilized when the manufacturing process does not allow creation of a coaxial via structure across the full electronic device carrier.

FIG. 7 illustrates another embodiment of the coaxial via structure to be used when the electronic device carrier comprises more than two conductive layers on one side of the core and the manufacturing process does not allow creation the external track of the coaxial via structure in the layers that are located above and under the core. In such a case, the electrical connection between two shielding tracks positioned on two adjacent conductive layers is done through several vias. The track portion to which vias are connected is designed so that it provides an efficient shielding effect. The shape of these tracks can be any geometrical solid metal shape. In this embodiment, the shape of the track portion looks like an annular ring. Vias arranged between second and third conductive layers (described below) are not disposed at the same locations as vias arranged between first and second conductive layers (described below), when considering z axis, to avoid manufacturing and electrical connection drawbacks.

With reference in particular to FIG. 7, there is depicted a staked via structure combined with a coaxial via structure, adapted to connect conductive tracks on two different conductive layers that are separated by a third conductive layer. In this example, a first conductive layer 700a is located on the surface of core 705, a second conductive layer 700b is located above conductive layer 700a, conductive layers 700a and 700b being separated by a dielectric layer 710a, and third conductive layer 700c is located above conductive layer 700b, conductive layers 700b and 700c being separated by a dielectric layer 710b. The depicted structure comprises a coaxial central track 715 of the coaxial via structure that projects from core 705, travels through conductive layers 700a and 700b and is connected to conductive track 720 of conductive layer 700c. The first conductive layer 700a comprises one conductive track 725 having the shape of an annular ring that is connected to the external track 730 of the coaxial via structure. Four vias 735-1 to 735-4 (generically referred to as 735) are connected to annular ring 725 so as to provide an electrical connection with conductive track 740 also having the shape of an annular ring, positioned on conductive layer 700b adjacent to conductive layer 700a. As described above, conductive layers 700a and 700b are separated by dielectric layer 710a. Vias 735-1 to 735-4 are symmetrically arranged with respect to conductive tracks 725 and 740 so as to provide an efficient shielding effect. To improve shielding effect, more vias 735 may be used. A similar structure is duplicated between conductive layers 700b and 700c, taking into account signal track 720. Three vias 750-1 to 750-3 (generically referred to as 750) are connected to conductive track 740 so as to provide an electrical connection with conductive track 755, positioned on conductive layer 700c. Each via 750 is preferably connected to conductive track 740 such that the distances between itself and the two closest vias 735 are the same to obtain a uniform shielding effect. In the illustrated example of FIG. 7, conductive tracks 725, 740, and a portion of conductive track 755 are approximately of the same size and are substantially aligned along a z axis. Vias 735 are positioned at positions 0°, 90°, 180° and 270° considering the center of conductive tracks 725 and 740 with the z axis and vias 750 are set at positions 45°, 135° and 225°.

Figure 8:
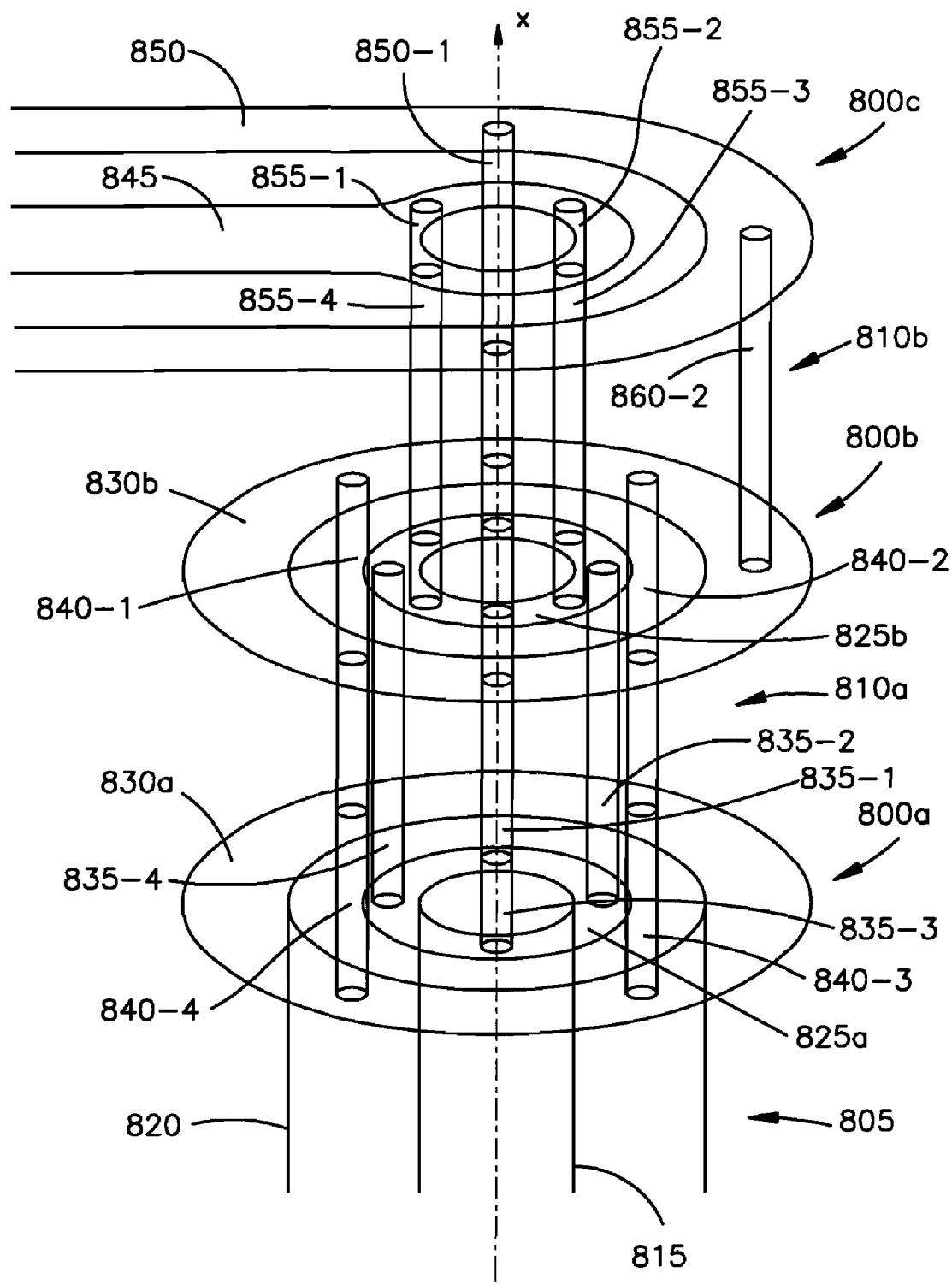

FIG. 8 represents another embodiment of the coaxial via structure to be used when the electronic device carrier comprises more than two conductive layers on one side of the core and the process does not allow drilling the full electronic device carrier thickness, i.e. to create the conductive tracks of the coaxial via structure in the layers that are located above and under the core. This situation arises in particular when a larger diameter hole is formed with a mechanical drill bit that may damage the conductive tracks designed in the external layers. In such case, the electrical connection between two tracks on two adjacent conductive layers can be accomplished through several vias, at least two and preferably four for connecting tracks carrying high speed signals. The track portion to which vias are connected is designed so that it provides a symmetrical distribution of signal current across these vias and an efficient shielding effect. The shape of these tracks can be any geometrical solid metal shape. In this embodiment, the shape of the track portion is an annular ring. Vias arranged between a second and third conductive layer are not disposed at the same locations as vias arranged between a first and the second conductive layers, when considering the z axis, to avoid manufacturing and electrical connection drawbacks. As illustrated, the same structure is formed for the central and external tracks of the coaxial via structure.

Thus, there is depicted in FIG. 8 a staked via structure combined with a coaxial via structure, adapted to connect conductive tracks belonging to two different conductive layers that are separated by a third conductive layer. In this example, a first conductive layer 800*a* is located on the surface of core 805, a second conductive layer 800*b* is located above conductive layer 800*a*, conductive layers 800*a* and 800*b* being separated by a dielectric layer 810*a*, and third conductive layer 800*c* is located above conductive layer 800*b*, conductive layers 800*b* and 800*c* being separated by a dielectric layer 810*b*. The core 805 comprises a coaxial via structure having a central conductive track 815 and an external conductive track 820. Two concentric conductive tracks 825*a* and 830*a* are positioned in conductive layer 800*a* such that they are aligned with conductive tracks 815 and 820, conductive track 825*a* being connected to conductive track 815 and conductive track 830*a* being connected to conductive track 820. Conductive tracks 825*a* and 830*a* have the shape of annular rings. Likewise, conductive layer 800*b* comprises two concentric conductive tracks 825*b* and 830*b* having also the shape of annular rings and being substantially aligned with conductive tracks 825*a* and 830*a* according to the z axis. Two sets of vias connect conductive tracks 825*a* and 830*a* to conductive tracks 825*b* and 830*b*, respectively. Four vias 835-1 to 835-4 (generically referred to as 835) of the first set of vias are connected to conductive track 825*a* so as to provide an electrical connection with conductive track 825*b*. Vias 835-1 to 835-4 are symmetrically arranged on conductive tracks 825*a* and 825*b* so that the electrical signal current flow can be uniformly distributed among them. Likewise, four vias 840-1 to 840-4 (generically referred to as 840) of the second set of vias are connected to conductive track 830*a* so as to provide an electrical connection with conductive track 830*b*. Vias 840-1 to 840-4 are symmetrically arranged on conductive tracks 830*a* and 830*b* so as to provide an efficient shielding effect that may be improved by increasing the number of vias 840. A similar structure can be duplicated between conductive layers 800*b* and 800*c*, taking into account high speed signal track 845 and shielding track 850 of conductive layer 800*c*. Two sets of vias connect conductive tracks 825*b* and 830*b* to conductive tracks 845 and 850, respectively. Four vias 855-1 to 855-4 (generically referred to as 855) of the first set of vias are connected to conductive track 825*b* so as to provide an electrical connection with conductive track 845. Vias 855-1 to 855-4 are symmetrically arranged on conductive tracks 825*b* and 845 so that the electrical signal current flow can be uniformly distributed among them. Each of the vias 855 is preferably connected to conductive track 825*b* such that the distance between itself and the two closest vias 835 are the same to obtain a uniform distribution of electrical signal current flow from vias 835 to vias 855. In the illustrated example of FIG. 8, conductive tracks 825*a*, 825*b*, and a portion of conductive track 845 are of approximately the same size and substantially aligned along the z axis. Vias 835 are set at positions 0°, 90°, 180° and 270° considering the center of conductive tracks 825*a* and 825*b* with z axis and vias 855 are set at positions 45°, 135°, 225° and 315°. Likewise, three vias 860-1 to 860-3 (generically referred to as 860) of the second set of vias are connected to conductive track 830*b* so as to provide an electrical connection with conductive track 850. Vias 860-1 to 860-3 are symmetrically arranged on conductive tracks 850*a* and 830*b* so as to provide an efficient shielding effect that may be improved by increasing the number of vias 860. Each of the vias 860 is preferably connected to conductive track 830*b* such that the distance between itself and the two closest vias 840 are the same to obtain a uniform shielding effect. In this example, conductive tracks 830*a*, 830*b*, and a portion of conductive track 850 are of substantially the same size and aligned along the z axis. Vias 840 are set at positions 0°, 90°, 180° and 270° considering the center of conductive tracks 830*a* and 830*b* with the z axis and vias 860 are set at positions 45°, 135°, and 225°.

A similar structure may be achieved without conductive track 825*a* if the wall thickness of central track 815 is large enough to connect vias 835-1 to 835-4.

Figure 9:
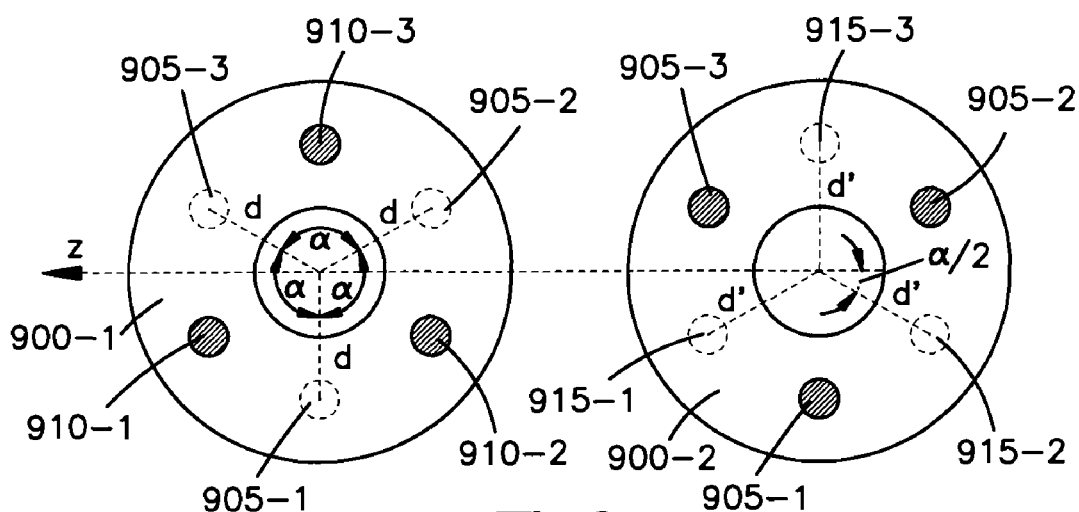
FIG. 9 illustrates a plan view of a via orientation utilized to carry high speed signals between conductive tracks of two adjacent conductive layers.

In FIG. 9, it is shown how vias are preferably disposed when three of the vias are used to connect conductive tracks of two adjacent conductive layers, particularly when connecting tracks carrying high speed signals. As described above, the vias are preferably disposed so as to distribute uniformly the electrical signal current flow among the vias. FIG. 9 comprises a plan view of two annular rings 900-1 and 900-2 that are positioned in two adjacent conductive layers about a z axis, annular ring 900-1 being formed in an upper conductive layer. Thus, considering annular rings 900-1 and 900-2, vias 905-1, 905-2, and 905-3 that link the two annular rings must be placed on lines forming an angle of a=360°/n=120° according to the z axis, n being the number of vias used to connect two adjacent conductive layer in the stacked via structure, i.e. n=3 in this example. Furthermore, the distances d between the via centers and the center of the annular rings 900-1 and 900-2 must be substantially the same. Likewise, the three vias 910-1, 910-2, and 910-3 that connect annular ring 900-1 to a conductive track of a conductive layer above annular ring 900-1 and the three vias 915-1, 915-2, and 915-3 that connect annular ring 900-2 to a conductive track of a conductive layer below annular ring 900-2 should be disposed according to the position of vias 905-1, 905-2, and 905-3. Vias 910-1, 910-2, and 910-3 must be placed on lines forming an angle of a=120°, perpendicular to the z axis, these lines forming an angle of a/2=60° with the lines on which vias 905-1, 905-2, and 905-3 are positioned. It is not necessary for distance d' between the center of vias 915-1, 915-2, and 915-3 and the center of the annular ring to be equal to the distance d between the center of vias 905-1, 905-2, and 905-3 and the center of the annular rings 900-1 and 900-2.

Figure 10:
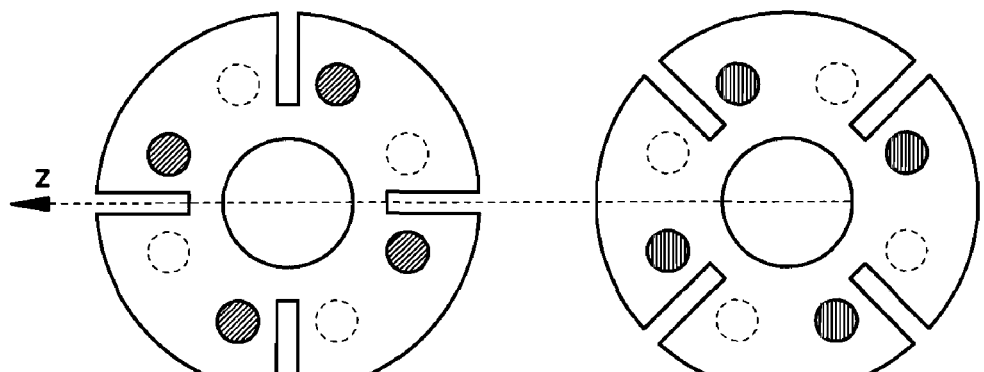
FIGS. 10 and 11 illustrate alternative examples of shapes of conductive layer tracks on which vias are connected that can be used in the invention of FIGS. 7 and 8.
Figure 11:
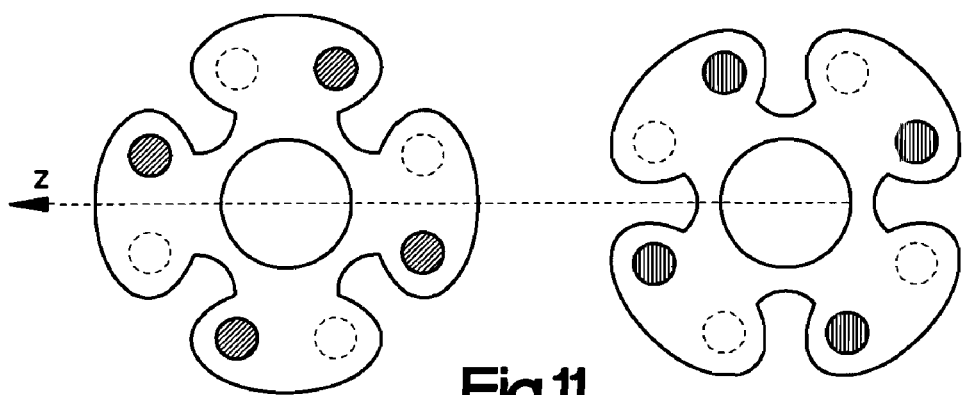

FIGS. 10 and 11 illustrates examples of conductive tracks that may be substituted for the above mentioned annular rings of the stacked via structure. Each figure comprises conductive tracks of two adjacent conductive layers and an example of the position of the vias when four vias are used to connect to adjacent conductive tracks. These conductive tracks show a relative rotation of 45° on each of the given layers 900-*n* (n being the number of the layers available on the different side of the core laminate structures). The configuration with inserted slots in the annular ring or a design with lobes avoids establishment of loops for currents that will generate an adverse condition to the propagation of the electromagnetic wave.

Figure 12:
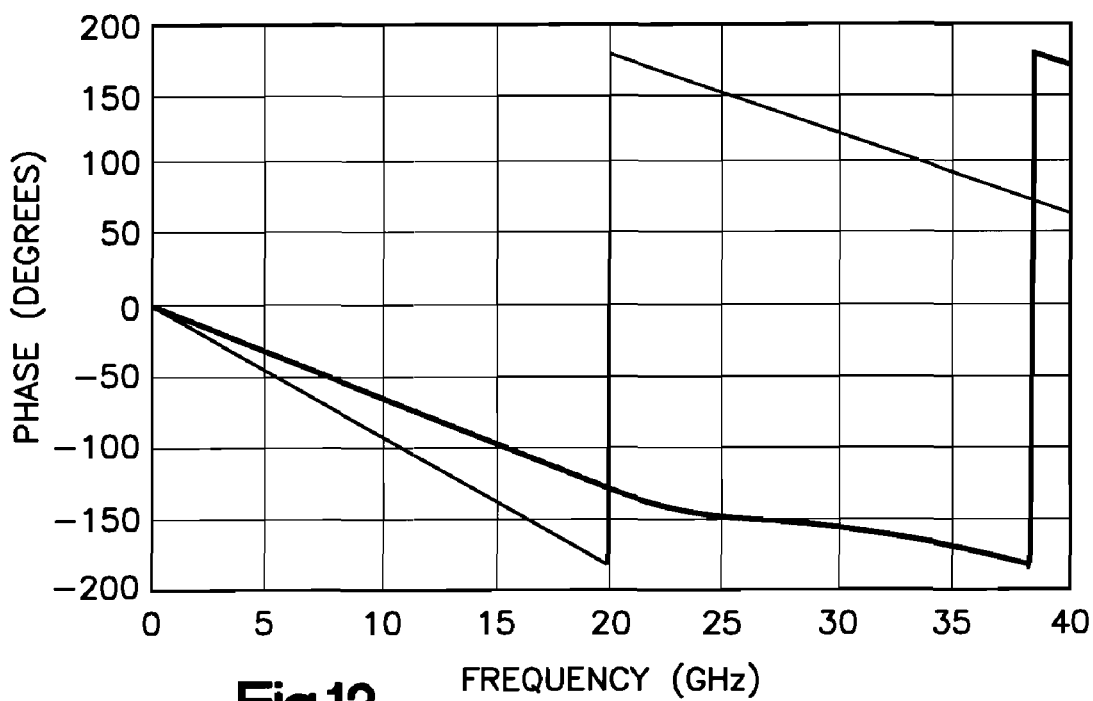
FIGS. 12 and 13 represent diagrams illustrating the advantages provided by the coaxial via structure of the current invention in terms of electrical behavior by comparing the output of a design example for a known electronic device (curve a) with an electronic device including the coaxial via structure of the invention (curve b).
Figure 13:
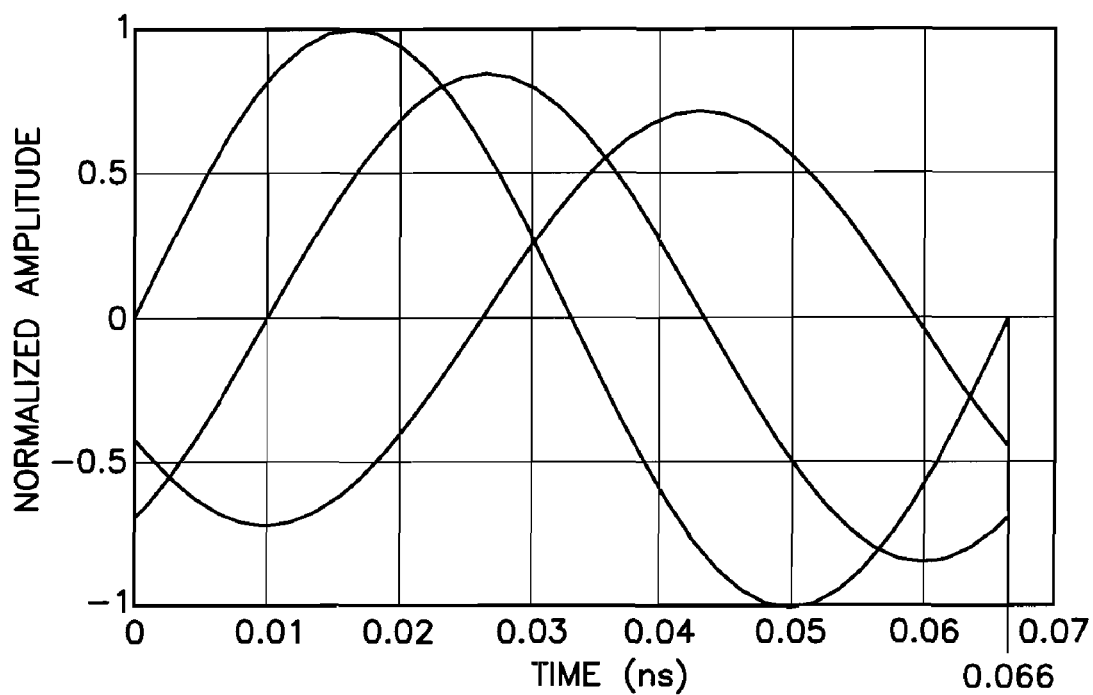

With reference to FIG. 12, there is depicted a diagram representing the phase versus the frequency for a known electronic module wherein electrical connection between conductive layers are not shielded (curve a) and for an electronic device comprising the coaxial via structure of the current invention (curve b). This diagram shows that even if mechanically these two structures are comparable allowing the vertical (Z) path transition of the conductive tracks, they result in a complete different electrical behaviour. This difference translates into different delays in the transmission of an incident electrical signal. In an application example using a 15 Ghz signal (equal to a cycle time of about 66 picoseconds (ps)) the two structures show a difference in delay of about 17 ps on the incident wave, as illustrated in FIG. 13 wherein curve s corresponds to the input signal. Such a delay difference represents a quarter of the total cycle time allowing, in the case of stacked structure usage, a better signal management with a lower distortion effect on signal fronts.

In order to satisfy local and specific requirements, a person skilled in the art may apply to the solution described above many modifications and alterations all of which, however, are included within the scope of protection of the invention as defined by the following claims.

What is claimed is:

1. A method of forming a coaxial via structure in an electronic device carrier adapted to connect power/ground voltage comprising the steps of:

forming a first generally round conductive track of a first conductive layer on a first surface of a dielectric core;

forming a second generally round conductive track of a second conductive layer in a central portion of said dielectric core, and forming a third generally round conductive track of a third conductive layer, said conductive layers being separated by dielectric layers;

forming a coaxial via structure having at least two first conductive vias for conducting voltage only connected to said first and second conductive tracks;

forming at least two second conductive vias for conducting voltage only connected to said second and third conductive tracks;

forming a fourth generally round conductive track of a fourth conductive layer surrounding and on the same level as said first conductive layer;

forming a fifth generally round conductive track of a fifth conductive layer surrounding and on the same level as said second conductive layer;

forming a sixth generally round conductive track of a sixth conductive layer surrounding and on the same level as said third conductive layer;

at least two third conductive vias for conducting voltage only being connected to said fourth and fifth conductive tracks; and at least two fourth conductive vias conducting voltage only being connected to said fifth and sixth conductive tracks.

2. The method as defined in claim 1 wherein there are at least four vias of either the first set of vias or the second set of vias.

3. The method as defined in claim 1 wherein the vias of at least one set of vias are symmetrically arranged with respect to each other.

4. The method as defined in claim 1 wherein the vias of each set of vias are symmetrically arranged with respect to each other.

* * * * *